US006975072B2

(12) United States Patent
Leung et al.

(10) Patent No.: US 6,975,072 B2
(45) Date of Patent: Dec. 13, 2005

(54) ION SOURCE WITH EXTERNAL RF ANTENNA

(75) Inventors: Ka-Ngo Leung, Hercules, CA (US); Qing Ji, Albany, CA (US); Stephen Wilde, Pleasant Hill, CA (US)

(73) Assignee: The Regents of the University of California, Oakland, CA (US)

( * ) Notice: Subject to any disclaimer, the term of this patent is extended or adjusted under 35 U.S.C. 154(b) by 16 days.

(21) Appl. No.: 10/443,575

(22) Filed: May 22, 2003

(65) Prior Publication Data

US 2003/0218430 A1 Nov. 27, 2003

Related U.S. Application Data

(60) Provisional application No. 60/382,674, filed on May 22, 2002.

(51) Int. Cl.[7] .......................... H01J 7/24; C23C 16/00

(52) U.S. Cl. .......................... 315/111.21; 118/723 R

(58) Field of Search .......................... 315/111.21, 111.81; 118/728, 723 R, 723 E, 723 I, 723 MW, 723 AN; 250/251; 204/297.03

(56) References Cited

U.S. PATENT DOCUMENTS 2,769,096 A 10/1956 Frey
2,983,834 A 5/1961 Reiffel
3,015,032 A 12/1961 Hoyer
3,113,213 A 12/1963 Brinkerhoff
3,258,402 A 6/1966 Farnsworth
3,417,245 A 12/1968 Schmidt
3,609,369 A 9/1971 Croitoru
3,664,960 A 5/1972 Wood
3,846,636 A 11/1974 Zehr et al. .................... 250/84
4,076,990 A 2/1978 Hendry (Continued)

OTHER PUBLICATIONS

Douglas M. Considine, Editor, "flange (a definition)," Van Nostran's Scientific Encyclopedia, 8th ed. Van Nostrand Reinhold (New York, USA), p. 2, (Mar. 16, 1994).

Sybil P. Parker, Editor in Chief, "flange (a definition)," McGraw Hill Dictionary of Scientific and Technical Terms, 5th ed., McGraw Hill (USA), p. 2, (Mar. 16, 1994).

Lomer, P.D.;Bounden, J.E.; Wood, J.D.L.H., "High Output Neutron Generating Tubes," Conf–650405–2, Services Electronics Ranch Lab (Baldock, England), p. 623–34, (Sep. 1, 1964).

Eyrich, W.; Schmidt, A., "Two Compact, High–Intensity Pulsed Neutron Sources," Tehnical Report No. KFK–304; SM–62/4; SM–62/4, Federal Republic of Germany (Germany), p. 589–608, (May 1, 1965).

Lomer, P.D.;Bounden, J.E.; Wood, J.D.L.H., "A Neutron Tube with Constant Output," Nucl. Instr. Methods, Services Electronics Resrch Lab (Baldock, England), p. 283–288, (Mar. 1, 1965).

*Primary Examiner*—Tuyet Vo
*Assistant Examiner*—Minh Dieu A
(74) *Attorney, Agent, or Firm*—Joseph R. Milner

(57) ABSTRACT

A radio frequency (RF) driven plasma ion source has an external RF antenna, i.e. the RF antenna is positioned outside the plasma generating chamber rather than inside. The RF antenna is typically formed of a small diameter metal tube coated with an insulator. An external RF antenna assembly is used to mount the external RF antenna to the ion source. The RF antenna tubing is wound around the external RF antenna assembly to form a coil. The external RF antenna assembly is formed of a material, e.g. quartz, which is essentially transparent to the RF waves. The external RF antenna assembly is attached to and forms a part of the plasma source chamber so that the RF waves emitted by the RF antenna enter into the inside of the plasma chamber and ionize a gas contained therein. The plasma ion source is typically a multi-cusp ion source.

15 Claims, 5 Drawing Sheets

U.S. PATENT DOCUMENTS

| | | | | | |
|---|---|---|---|---|---|
| 4,290,847 | A | | 9/1981 | Johnson | |
| 4,395,631 | A | | 7/1983 | Salisbury | 250/251 |
| 4,447,732 | A | | 5/1984 | Leung et al. | 250/427 |
| 4,529,571 | A | | 7/1985 | Bacon et al. | 376/144 |
| 4,654,561 | A | | 3/1987 | Shelton | |
| 4,725,449 | A | | 2/1988 | Ehlers et al. | 427/49 |
| 4,793,961 | A | | 12/1988 | Ehlers et al. | 376/127 |
| 4,806,829 | A | | 2/1989 | Nakao | |
| 4,935,194 | A | | 6/1990 | Verschoore | |
| 4,977,352 | A | | 12/1990 | Williamson | |
| 5,008,800 | A | | 4/1991 | Klinkowstein | |
| 5,053,184 | A | | 10/1991 | Cluzeau | |
| 5,135,704 | A | | 8/1992 | Shefer | |
| 5,198,677 | A | | 3/1993 | Leung et al. | 250/424 |
| 5,215,703 | A | | 6/1993 | Bernardet | |
| 5,434,353 | A | | 7/1995 | Kraus | 174/15.6 |
| 5,587,226 | A | | 12/1996 | Leung et al. | 428/210 |
| 5,745,536 | A | | 4/1998 | Brainard | |
| 5,969,470 | A | | 10/1999 | Druz | |
| 6,094,012 | A | | 7/2000 | Leung et al. | 315/111.81 |
| 6,124,834 | A | | 9/2000 | Leung et al. | 343/867 |
| 6,141,395 | A | | 10/2000 | Nishimura | |
| 6,184,625 | B1 | | 2/2001 | Ogura | |
| 6,217,724 | B1 | * | 4/2001 | Chu et al. | 204/192.37 |
| 6,228,176 | B1 | * | 5/2001 | Chu et al. | 118/728 |
| 6,269,765 | B1 | * | 8/2001 | Chu et al. | 118/723 I |
| 6,376,978 | B1 | | 4/2002 | Leung et al. | 313/359.1 |
| 2002/0150193 | A1 | | 10/2002 | Leung et al. | 376/108 |
| 2003/0146803 | A1 | * | 8/2003 | Pickard et al. | 333/32 |

* cited by examiner

ION SOURCE WITH EXTERNAL RF ANTENNA

RELATED APPLICATIONS

This application claims priority of Provisional Application Ser. No. 60/382,674 filed May 22, 2002, which is herein incorporated by reference.

GOVERNMENT RIGHTS

The United States Government has the rights in this invention pursuant to Contract No.DE-AC03-76SF00098 between the United States Department of Energy and the University of California.

BACKGROUND OF THE INVENTION

The invention relates to radio frequency (RF) driver plasma ion sources, and more particularly to the RF antenna and the plasma chamber.

A plasma ion source is a plasma generator from which beams of ions can be extracted. Multi-cusp ion sources have an arrangement of magnets that form magnetic cusp fields to contain the plasma in the plasma chamber. Plasma can be generated in a plasma ion source by DC discharge or RF induction discharge. An ion plasma is produced from a gas which is introduced into the chamber. The ion source also includes an extraction electrode system at its outlet to electrostatically control the passage of ions from the plasma out of the plasma chamber.

Unlike the filament DC discharge where eroded filament material can contaminate the chamber, RF discharges generally have a longer lifetime and cleaner operation. In a RF driven source, an induction coil or antenna is placed inside the ion source chamber and used for the discharge. However, there are still problems with internal RF antennas for plasma ion source applications.

The earliest RF antennas were made of bare conductors, but were subject to arcing and contamination. The bare antenna coils were then covered with sleeving material made of woven glass or quartz fibers or ceramic, but these were poor insulators. Glass or porcelain coated metal tubes were subject to differential thermal expansion between the coating and the conductor, which could lead to chipping and contamination. Glass tubes form good insulators for RF antennas, but in a design having a glass tube containing a wire or internal surface coating of a conductor, coolant flowing through the glass tube is subject to leakage upon beakage of the glass tube, thereby contaminating the entire apparatus in which the antenna is mounted with coolant. A metal tube disposed within a glass or quartz tube is difficult to fabricate and only has a few antenna turns.

U.S. Pat. Nos. 4,725,449; 5,434,353; 5,587,226; 6,124,834; 6,376,978 describe various internal RF antennas for plasma ion sources, and are herein incorporated by reference.

SUMMARY OF THE INVENTION

Accordingly, it is an object of the invention to provide an improved plasma ion source that eliminates the problems of an internal RF antenna.

The invention is a radio frequency (RF) driven plasma ion source with an external RF antenna, i.e. the RF antenna is positioned outside the plasma generating chamber rather than inside. The RF antenna is typically formed of a small diameter metal tube coated with an insulator. Two flanges are used to mount the external RF antenna assembly to the ion source. The RF antenna tubing is wound around an open inner cylinder to form a coil. The external RF antenna assembly is formed of a material, e.g. quartz, which is essentially transparent to the RF waves. The external RF antenna assembly is attached to and forms a part of the plasma source chamber so that the RF waves emitted by the RF antenna enter into the inside of the plasma chamber and ionize a gas contained therein. The plasma ion source is typically a multi-cusp ion source.

DETAILED DESCRIPTION OF THE INVENTION

The principles of plasma ion sources are well known in the art. Conventional multicusp plasma ion sources are illustrated by U.S. Pat. Nos. 4,793,961; 4,447,732; 5,198,677; 6,094,012, which are herein incorporated by reference.

Figure 1:
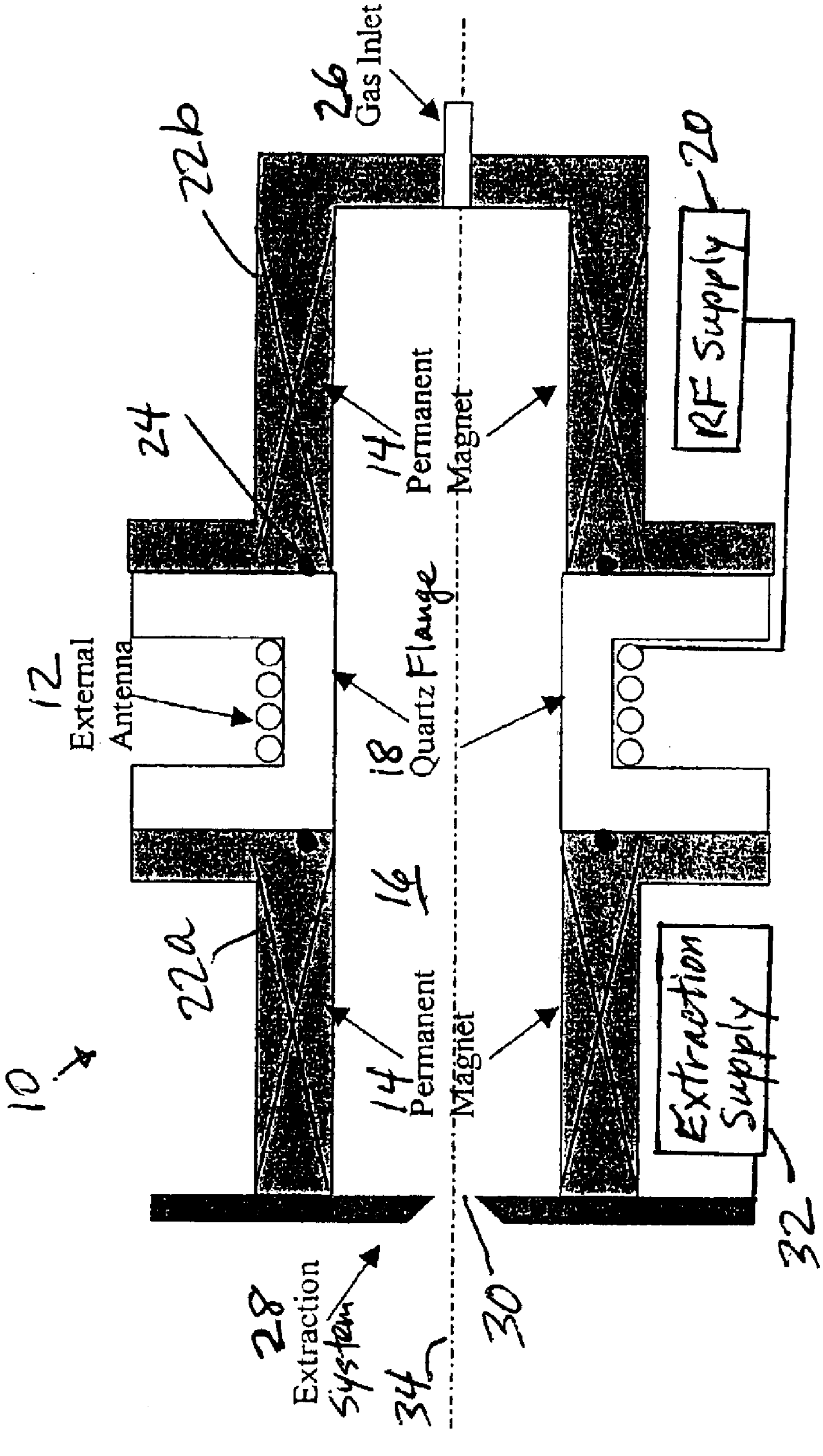
FIGS. 1–5 are side cross sectional views of various embodiments of a plasma ion source with an external RF antenna according to the invention.

A plasma ion source 10, which incorporates an external RF antenna 12, is illustrated in FIG. 1. Plasma ion source 10 is preferably a multi-cusp ion source having a plurality of permanent magnets 14 arranged with alternating polarity around a source chamber 16, which is typically cylindrical in shape. External antenna 12 is wound around external RF antenna assembly 18 and electrically connected to a RF power source 20 (which includes suitable matching circuits), typically 2 MHz or 13.5 MHz. The external RF antenna assembly 18 is made of a material such as quartz that easily transmits the RF waves. The external RF antenna assembly 18 is mounted between two plasma chamber body sections 22*a*, 22*b*, typically with O-rings 24 providing a seal. Chamber body sections 22*a*, 22*b* are typically made of metal or other material that does not transmit RF waves therethrough. The chamber body sections 22*a*, 22*b* and the external RF antenna assembly 18 together define the plasma chamber 16 therein. Gas inlet 26 in (or near) one end of chamber 16 allows the gas to be ionized to be input into source chamber 16.

The opposed end of the ion source chamber 16 is closed by an extractor 28 which contain a central aperture 30 through which the ion beam can pass or be extracted by applying suitable voltages from an associated extraction power supply 32. Extractor 28 is shown as a simple single electrode but may be a more complex system, e.g. formed of a plasma electrode and an extraction electrode, as is known in the art. Extractor 28 is also shown with a single extraction aperture 30 but may contain a plurality of apertures for multiple beamlet extraction.

In operation, the RF driven plasma ion source 10 produces ions in source chamber 16 by inductively coupling RF power from external RF antenna 12 through the external RF antenna assembly 18 into the gas in chamber 16. The ions are extracted along beam axis 34 through extractor 28. The ions can be positive or negative; electrons can also be extracted.

FIGS. 2–5 show variations of the plasma ion source shown in FIG. 1. Common elements are the same and are not described again or even shown again. Only the differences or additional elements are further described.

Figure 2:
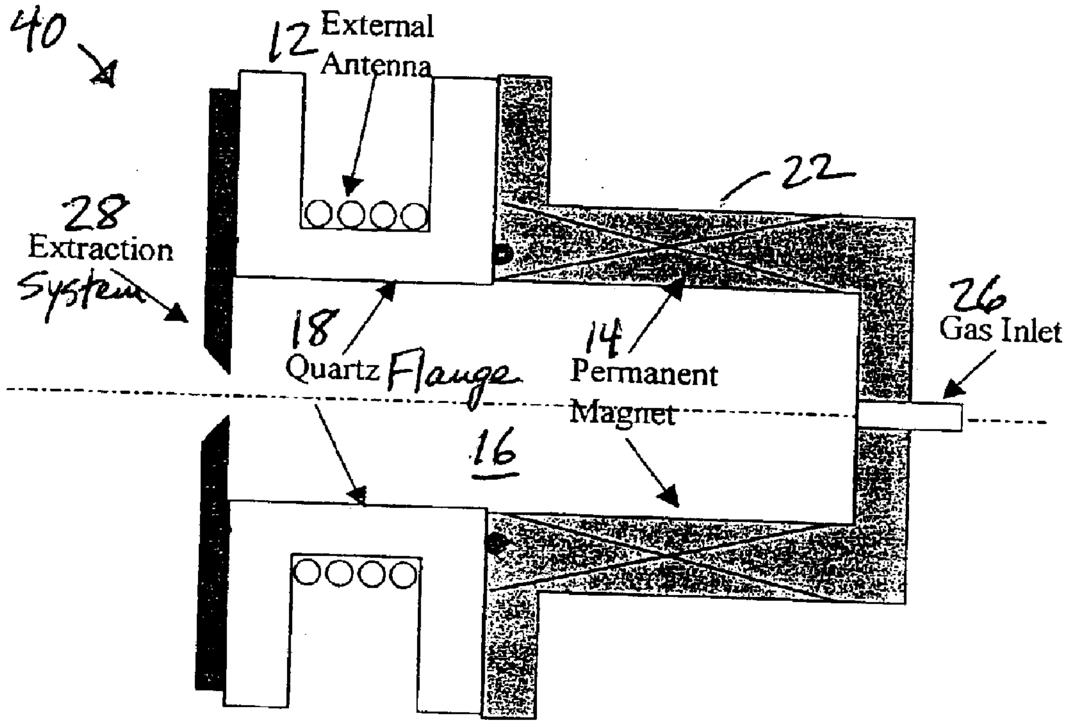

Plasma ion source 40, shown in FIG. 2 is similar to plasma ion source 10 of FIG. 1, except that the external RF antenna assembly 18 with external antenna 12 is mounted to one end of a single plasma chamber body section 22 instead of between two body sections 22*a*, 22*b*. The chamber body section 22 and the external RF antenna assembly 18 together define the plasma chamber 16 therein. The extractor 28 is mounted directly to the external RF antenna assembly 18 in place of the second body section so that external RF antenna assembly 18 is mounted between body section 22 and extractor 30.

Figure 3:
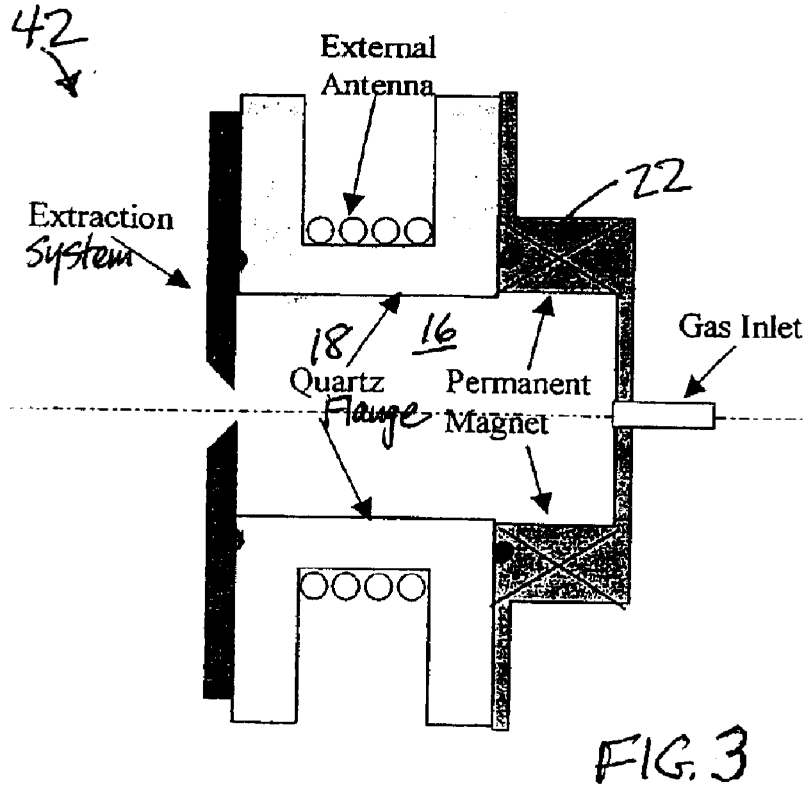

Plasma ion source 42, shown in FIG. 3, is similar to plasma ion source 40 of FIG. 2, with the external RF antenna assembly 18 with external antenna 12 mounted to the end of a single plasma chamber body section 22. However, ion source 42 is much more compact than ion source 40 since the chamber body section 22 is much shorter, i.e. chamber 16 is much shorter. In FIG. 2, the length of chamber body section 22 is much longer than the length of the external RF antenna assembly 12 while in FIG. 3 it is much shorter. Such a short ion source is not easy to achieve with an internal antenna.

Figure 4:
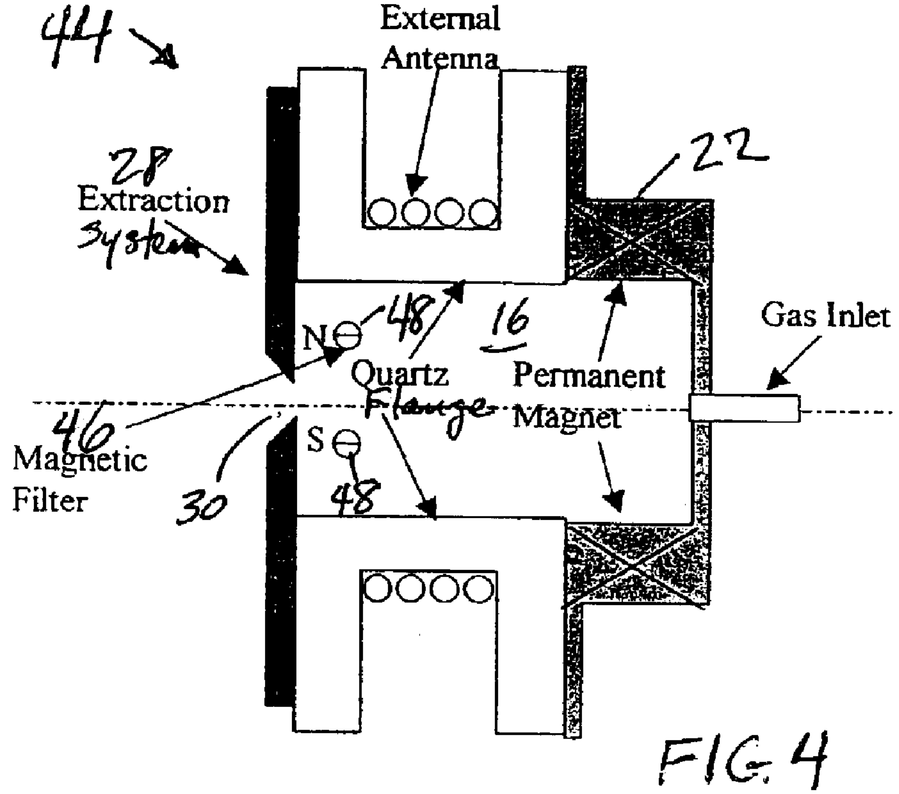

Plasma ion source 44, shown in FIG. 4, is similar to plasma ion source 42 of FIG. 3. A permanent magnet filter 46 formed of spaced magnets 48 is installed in the source chamber 16 of plasma ion source 44, adjacent to the extractor 28 (in front of aperture 30). Magnetic filter 46 reduces the energy spread of the extracted ions and enhances extraction of atomic ions.

Figure 5:
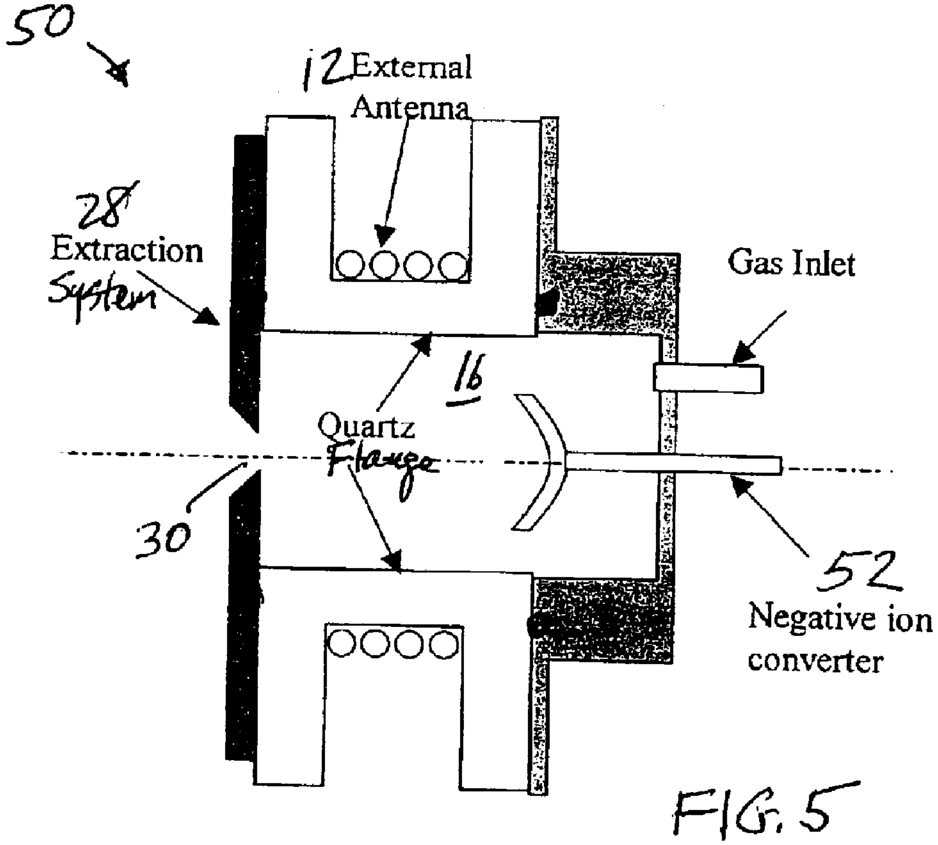

Plasma ion source 50, shown in FIG. 5, is similar to plasma ion source 42 of FIG. 3, but is designed for negative ion production. An external antenna arrangement is ideal for surface conversion negative ion production. A negative ion converter 52 is placed in the chamber 16. Antenna 12 is located between the converter 52 and aperture 30 of extractor 28. Dense plasma can be produced in front of the converter surface. The thickness of the plasma layer can be optimized to reduce the negative ion loss due to stripping.

Figure 6A:
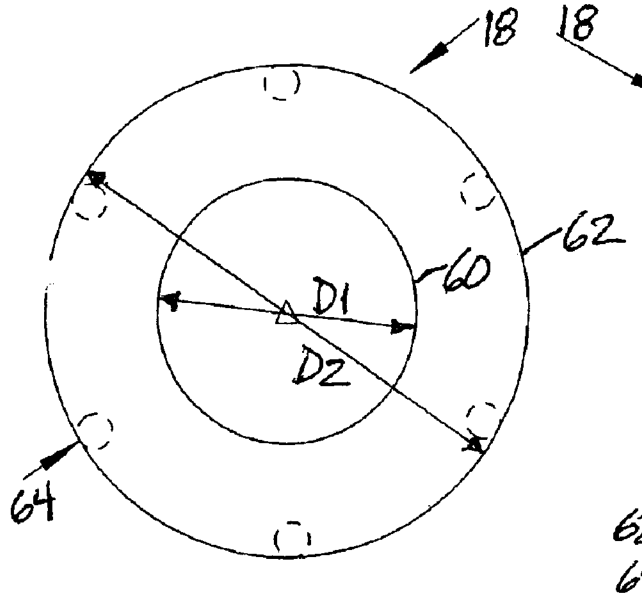
FIGS. 6A, B are end and side views of an external RF antenna assembly for mounting an external RF antenna to a plasma ion source according to the invention.
Figure 6B:
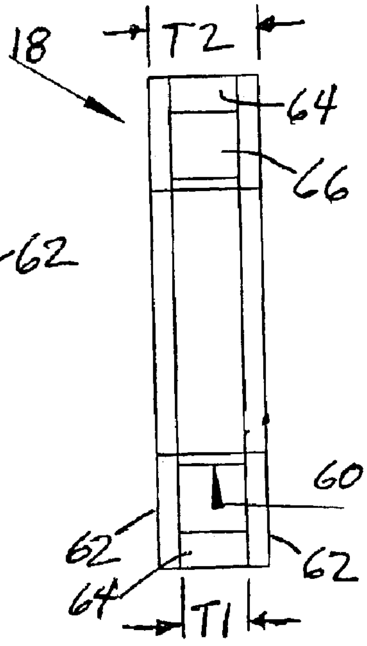

FIGS. 6A, B illustrate the structure of an external RF antenna assembly 18 of FIGS. 1–5 for housing and mounting an external antenna to a plasma ion source. The external RF antenna assembly 18 is formed of an open inner cylinder 60 having an inner diameter D1 and a pair of annular flanges 62 attached to the ends of cylinder 60 and extending outward (from inner diameter D1) to a greater outer diameter D2. Spaced around the outer perimeter of the annular flanges 62 are a plurality of support pins 64 extending between the flanges 62 to help maintain structural integrity. The inner cylinder 60 and extending flanges 62 define a channel 66 in which an RF antenna coil can be wound. The channel 66 has a length T1 and the flange has a total length T2.

The antenna is typically made of small diameter copper tubing (or other metal). A layer of Teflon or other insulator is used on the tubing for electrical insulation between turns. Coolant can be flowed through the coil tubing. If cooling is not needed, insulated wires can be used for the antenna coils. Many turns can be included, depending on the length T1 of the channel and the diameter of the tubing. Multilayered windings can also be used. Additional coils can be added over the antenna coils for other functions, such as applying a magnetic field.

Figure 7:
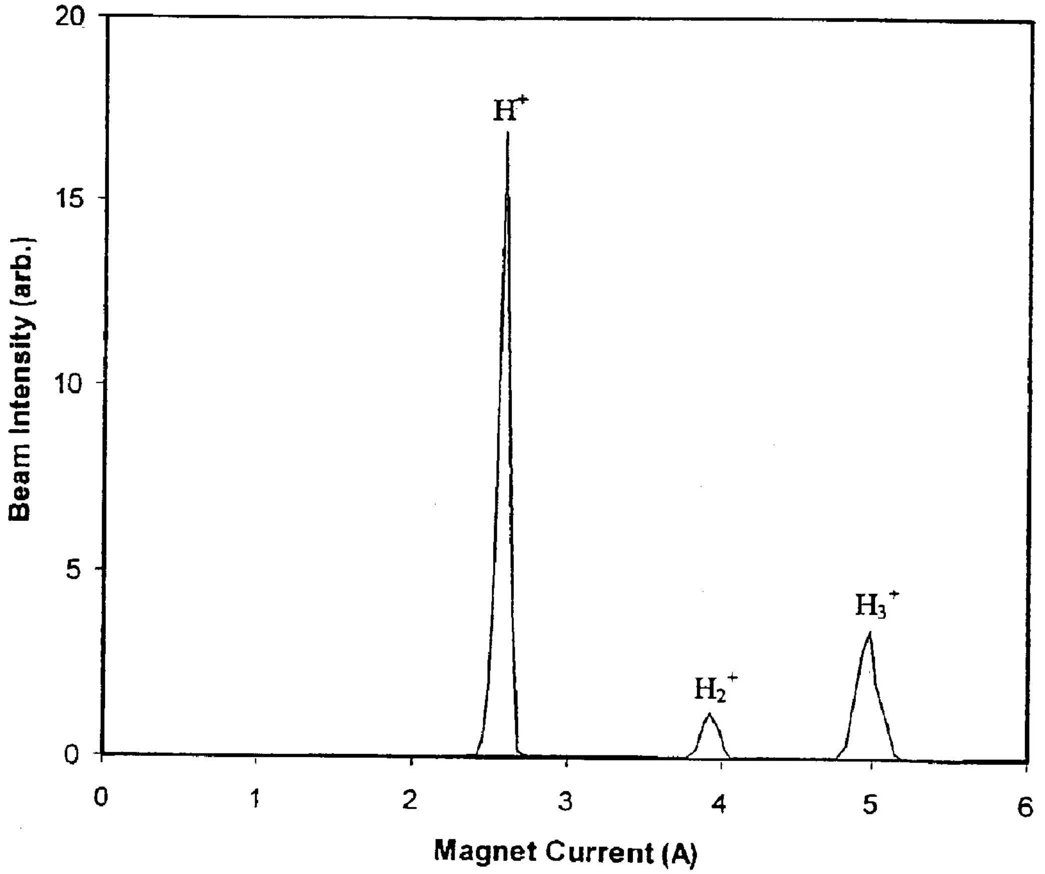
FIG. 7 is a graph of the relative amounts of various hydrogen ion species obtained with an external antenna source of the invention.

FIG. 7 is a graph of the relative amounts of various hydrogen ion species obtained with the source of FIG. 3. More than 75% of the atomic hydrogen ion $H^{30}$ was obtained with an RF power of 1 kW. The current density is about 50 mA/cm$^2$ at 1 kW of RF input power. The source has been operated with RF input power higher than 1.75 kW.

Figure 8:
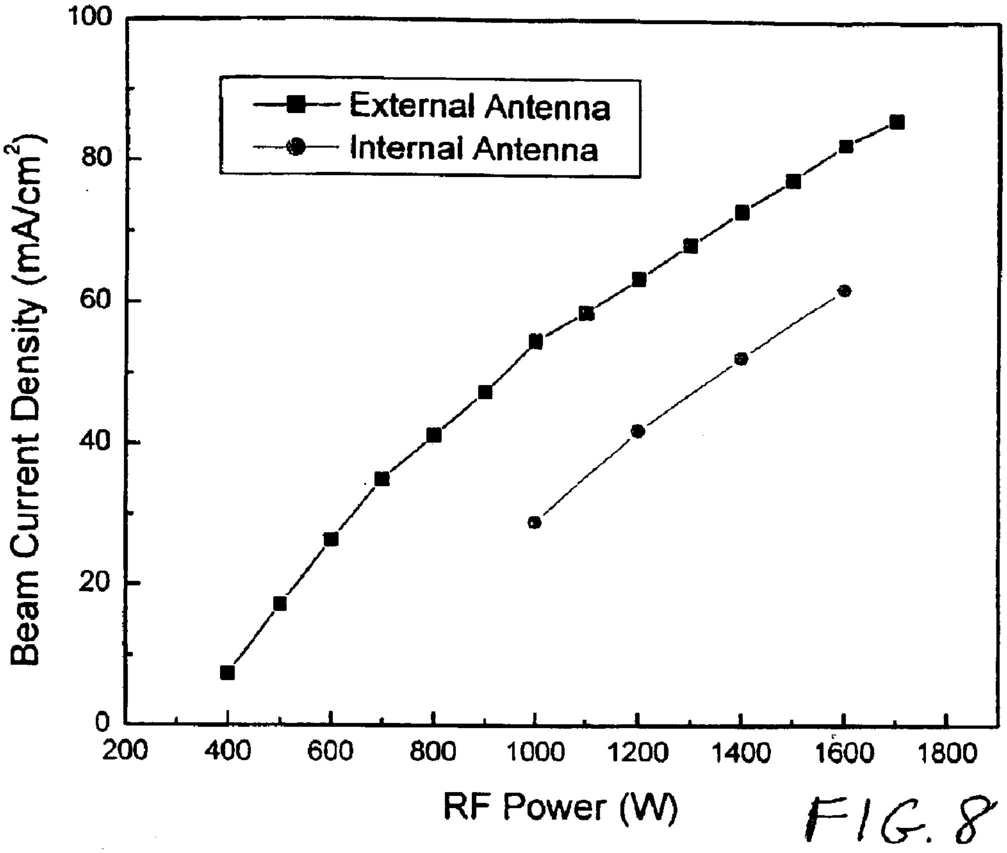
FIG. 8 is a graph of hydrogen ion current density extracted from an external antenna source and from an internal antenna source, at the same extraction voltage.

FIG. 8 is a comparison of hydrogen ion current density extracted from an external antenna source and from an internal antenna source. showing the extracted beam current density from an external antenna and internal antenna generated hydrogen plasma operating at the same extraction on voltage. When operating at the same RF input power, the beam current density extracted from the external antenna source is higher than that of the internal antenna source.

Figure 9:
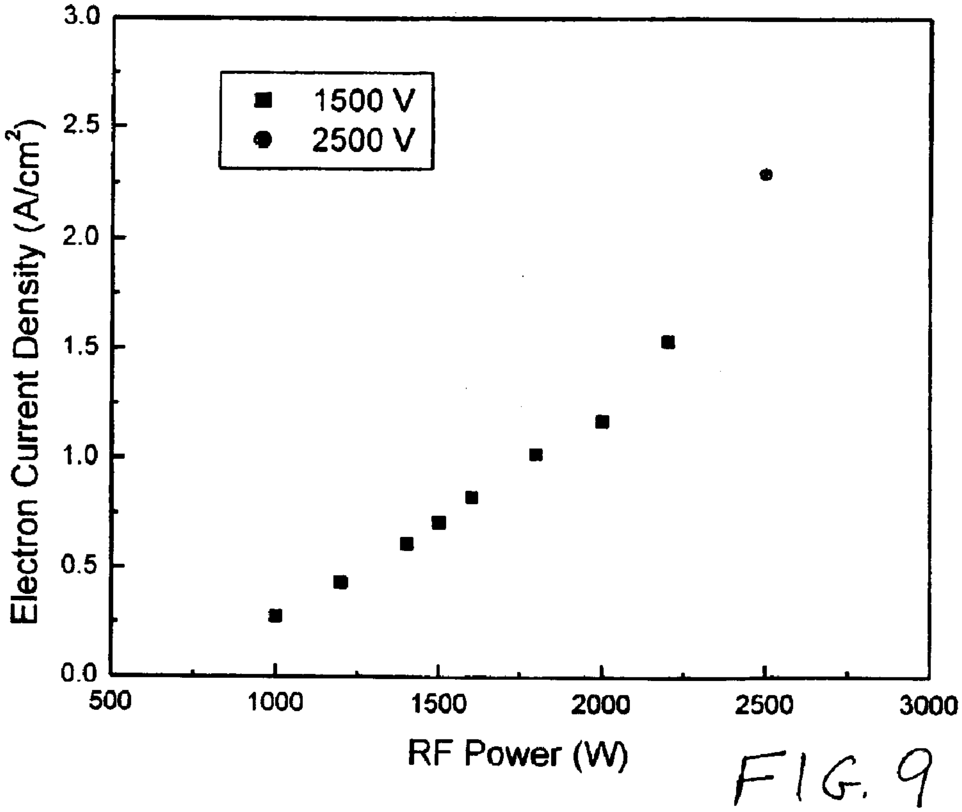
FIG. 9 is a graph of the electron current density produced by an external antenna source.

Simply by changing to negative extraction voltage, electrons can be extracted from the plasma generator using the same column. FIG. 9 shows the electron current density produced by an external antenna source. At an input power of 2500 W, electron current density of 2.5 A/cm$^2$ is achieved at 2500 V, which is about 25 times larger than ion production.

The ion source of the invention with external antenna enables operation of the source with extremely long lifetime. There are several advantages to the external antenna. First, the antenna is located outside the source chamber, eliminating a source of contamination, even if the antenna fails. Any mechanical failure of the antenna can be easily fixed without opening the source chamber. Second, the number of turns in the antenna coil can be large (>3). As a result the discharge can be easily operated in the inductive mode, which is much more efficient than the capacitive mode. The plasma can be operated at low source pressure. The plasma potential is low for the inductive mode. Therefore, sputtering of the metallic chamber wall is minimized. Third, plasma loss to the antenna structure is much reduced, enabling the design of compact ion sources. No ion bombardment of the external antenna occurs, also resulting in longer antenna lifetime.

RF driven ion sources of the invention with external antenna can be used in many applications, including H ion production for high energy accelerators, $H^{30}$ ion beams for ion beam lithography, $D^{30}/T^{30}$ ion beams for neutron generation, and boron or phosphorus beams for ion implantation. If electrons are extracted, the source can be used in electron projection lithography.

A source with external antenna is easy to scale from sizes as small as about 1 cm in diameter to about 10 cm in diameter or greater. Therefore, it can be easily adopted as a source for either a single beam or a multibeam system.

Changes and modifications in the specifically described embodiments can be carried out without departing from the scope of the invention which is intended to be limited only by the scope of the appended claims.

What is claimed is:

1. An external RF antenna assembly for a plasma ion source, comprising:

an antenna housing comprising:

an open cylinder with two ends; and a pair of flanges, one attached to each of the ends of the open cylinder and extending outward;

adapted to be attached to and form a part of a plasma ion source chamber, and formed of a material through which RF waves are easily transmitted;

an RF antenna coil wound on an outside surface of the open cylinder;

so that when the flanges are attached to the chamber, the antenna coil is external to the chamber, and RF waves emitted by the antenna coil are directed into the chamber through the antenna housing.

2. The RF antenna assembly of claim 1 wherein the flange is formed of quartz.

3. The RF antenna assembly of claim 1 wherein the antenna coil is made of copper or other conducting tubing.

4. The RF antenna assembly of claim 1 wherein the flange comprises:

a U-shaped channel defined by the inner cylinder and extending end flanges in which the RF antenna coil can be wound.

5. The RF antenna assembly of claim 4 further comprising:

a plurality of support pins spaced around the outer perimeter of the annular end flanges and extending between the end flanges to help maintain structural integrity.

6. The RF antenna assembly of claim 4 wherein the cylinder and end flanges are made of quartz.

7. A plasma ion source comprising:

a multicusp source chamber;

the external RF antenna assembly of claim 1 mounted external to the chamber;

an RF power source coupled to the RF antenna coil of claim 1.

8. A plasma ion source comprising:

a source chamber;

an external RF antenna assembly mounted to the chamber, the external RF antenna assembly comprising:

an antenna housing comprising:

an open cylinder with two ends; and a pair of flanges, one attached to each of the ends of the open cylinder and extending outward; and adapted to be attached to and form a part of the source chamber;

an RF antenna coil wound on an outside surface of the open cylinder;

so that when the flanges are attached to the chamber, the antenna coil is external to the chamber; and an RF power source coupled to the RF antenna.

9. The plasma ion source of claim 8 wherein the external RF antenna assembly comprises:

the antenna housing formed of a material through which RF waves are easily transmitted;

so that RF waves emitted by the RF antenna coil are directed into the chamber through the antenna housing.

10. The plasma ion source of claim 9 wherein the antenna housing is formed of quartz.

11. The plasma ion source of claim 9 wherein antenna coil is made of copper or other conducting tubing.

12. The plasma ion source of claim 9 wherein flanges, one each of;

the open cylinder and the flanges define a channel in which the RF antenna coil can be wound.

13. The plasma ion source of claim 12 further comprising a plurality of support pins spaced around the outer perimeter of the annular flanges and extending between the flanges to help maintain structural integrity.

14. The plasma ion source of claim 12 wherein the open cylinder and flanges are made of quartz.

15. The plasma ion source of claim 8 wherein the source chamber is a multi-cusp ion source chamber having a plurality of permanent magnets disposed around the chamber.

* * * * *